United States Patent
Tuttle et al.

(10) Patent No.: US 7,227,774 B2
(45) Date of Patent: * Jun. 5, 2007

(54) MRAM INTEGRATED CIRCUITS, MRAM CIRCUITS, AND SYSTEMS FOR TESTING MRAM INTEGRATED CIRCUITS

(75) Inventors: Mark E. Tuttle, Boise, ID (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/286,918

(22) Filed: Nov. 23, 2005

(65) Prior Publication Data

US 2006/0077704 A1   Apr. 13, 2006

Related U.S. Application Data

(63) Continuation of application No. 10/421,201, filed on Apr. 22, 2003, now Pat. No. 6,999,339.

(51) Int. Cl.
| | |
|---|---|
| G11C 11/00 | (2006.01) |
| G11C 27/00 | (2006.01) |
| G11C 5/02 | (2006.01) |
| G11C 5/06 | (2006.01) |
| G11C 7/04 | (2006.01) |
| G11C 11/34 | (2006.01) |

(52) U.S. Cl. ................ 365/158; 365/48; 365/51; 365/65; 365/211; 365/212; 365/213

(58) Field of Classification Search .......... 365/158, 365/48, 66, 211, 212, 213
See application file for complete search history.

(56) References Cited

U.S. PATENT DOCUMENTS

| | | | |
|---|---|---|---|
| 4,674,319 A | 6/1987 | Muller et al. | 73/24.01 |
| 5,600,576 A | 2/1997 | Broadwater et al. | 702/187 |
| 6,180,989 B1 | 1/2001 | Bryant et al. | 257/414 |
| 6,194,961 B1 | 2/2001 | Passerlaub | 327/566 |
| 6,263,740 B1 | 7/2001 | Sridhar et al. | 73/754 |
| 6,456,927 B1 | 9/2002 | Frankowski et al. | 701/111 |
| 6,545,896 B1 | 4/2003 | Munden et al. | 365/53 |
| 6,608,790 B2 | 8/2003 | Tran et al. | 365/211 |
| 6,627,932 B1 | 9/2003 | Drewes | 257/295 |
| 6,656,371 B2 | 12/2003 | Drewes | 216/22 |
| 6,667,682 B2 | 12/2003 | Wan et al. | 338/32 R |
| 6,683,806 B2 | 1/2004 | Drewes | 365/158 |
| 6,711,043 B2 | 3/2004 | Friedman et al. | 365/51 |
| 6,791,865 B2 | 9/2004 | Tran et al. | 365/158 |

(Continued)

OTHER PUBLICATIONS

Engel, Brad, et al., "The Science and Technology of Magnetoresistive Tunneling Memory" *IEEE Transactions of Nanotechnology*, vol. 1, No. 1, pp. 32-38 (Mar. 2002).

*Primary Examiner*—Amir Zarabian
*Assistant Examiner*—Ly Duy Pham
(74) *Attorney, Agent, or Firm*—Wells St. John, P.S.

(57) ABSTRACT

An integrated circuit includes operational circuitry; a sensor configured to sense an environmental parameter; and adjustment circuitry coupled to the sensor and to the operational circuitry and configured to affect the operational circuitry to at least partially counteract the effects of the environmental parameter. A method of testing an integrated circuit includes supporting a sensor in the integrated circuit and using the sensor to sense environmental data.

26 Claims, 3 Drawing Sheets

U.S. PATENT DOCUMENTS

| | | | |
|---|---|---|---|
| 6,806,523 B2 | 10/2004 | Mattson | 257/295 |
| 6,999,339 B2* | 2/2006 | Tuttle et al. | 365/158 |
| 2002/0114112 A1* | 8/2002 | Nakashio et al. | 360/324.2 |
| 2003/0011944 A1* | 1/2003 | Hosomi | 360/324.1 |
| 2004/0021990 A1* | 2/2004 | Koui et al. | 360/324.1 |
| 2005/0007694 A1* | 1/2005 | Takahashi | 360/112 |

* cited by examiner

MRAM INTEGRATED CIRCUITS, MRAM CIRCUITS, AND SYSTEMS FOR TESTING MRAM INTEGRATED CIRCUITS

CROSS REFERENCE TO RELATED APPLICATION

This is a continuation of U.S. patent application Ser. No. 10/421,201, filed Apr. 22, 2003, now U.S. Pat. No. 6,999,339, which is incorporated herein by reference.

TECHNICAL FIELD

The invention relates to integrated circuit sensors. The invention also relates to magnetoresistive random access memory circuits and methods.

BACKGROUND OF THE INVENTION

Rapid advances in communication, digital processing, and computing systems are creating an increasing demand for nonvolatile random access memory that is both high-density and highspeed. Existing solid-state technologies are unable to provide all of the needed attributes in a single memory solution. Therefore, a number of different memories are currently being used to achieve the multiple functionality requirements, often compromising performance and adding cost to the system. Magnetoresistive random access memory (MRAM) technology is known in the art. MRAMs use principles of magnetoresistive tunneling. Digital bits of information are defined by memory cells having alternate states of magnetization of magnetic materials. The magnetic materials can be thin ferromagnetic films. High-quality, nanometer scale tunneling barriers can be used that have enhanced magnetoresistive response.

Information can be stored and retrieved from the memory devices by inductive sensing to determine a magnetization state of the devices, or by magnetoresistive sensing of the magnetization states of the memory devices. It is noted that the term "magnetoresistive" characterizes the device and not the access method—a magnetoresistive device can be accessed by, for example, either inductive sensing or magnetoresistive sensing methodologies.

A significant amount of research is currently being invested in magnetic digital memories, such as, for example, MRAMs, because such memories are seen to have significant potential advantages relative to the dynamic random access memory (DRAM) components and static random access memory (SRAM) components that are presently in widespread use. For instance, a problem with DRAM is that it relies on power storage within capacitors. Such capacitors leak energy, and must be refreshed at intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices can potentially remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices. MRAMs are nonvolatile, and operate at highspeeds. They also have substantially unlimited read and write endurance.

Although MRAM devices have potential to be utilized as digital memory devices, they are currently not widely utilized. Several problems associated with MRAM technologies remain to be addressed. It would be desirable to develop improved MRAM devices.

Integrated circuit sensors are known in the art. For example, U.S. Pat. No. 6,180,989 to Bryant et al. (incorporated herein by reference) discloses an integrated circuit fingerprint sensor.

U.S. Pat. No. 4,674,319 to Muller et al. (incorporated herein by reference) relates to an integrated circuit sensor for vapor detection. A polysilicon microstructure is formed on a silicon substrate. Beneath the microstructure are diffused regions in the substrate. The microstructure is capacitively coupled to diffused regions so that one capacitor acts as an excitation capacitor and another capacitor acts as a sense capacitor. When an AC voltage is applied to the excitation capacitor, the electrostatic force between the substrate and the microstructure changes, causing a mechanical vibration in the microstructure. A DC voltage is applied to the sense capacitor. The mechanical vibration changes the capacitance of the sense capacitor and will develop a current through the sense capacitor. A phenomenon may then be sensed by the vibrating microstructure.

U.S. Pat. No. 6,194,961 to Passeraub (incorporated herein by reference) relates to a microstructure including an electronic circuit formed by a plurality of transistors and a flat coil. The coil is arranged on an upper face of a semiconductor substrate. The coil generates a magnetic field in this substrate in the vicinity of the transistors. The transistors are situated in superposition with the coil. The source and collector of the transistors are aligned along a direction perpendicular to the wire or path in the portion of the coil situated in proximity to each of the transistors. Thus, electric current flowing in the transistors is substantially parallel to the magnetic field.

U.S. Pat. No. 6,263,740 to Sridhar et al. (incorporated herein by reference) relates to a pressure sensor fabricated onto a substrate using conventional CMOS fabrication processes.

However, these integrated circuit sensors do not sense environmental information that may affect operation of the integrated circuit itself.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
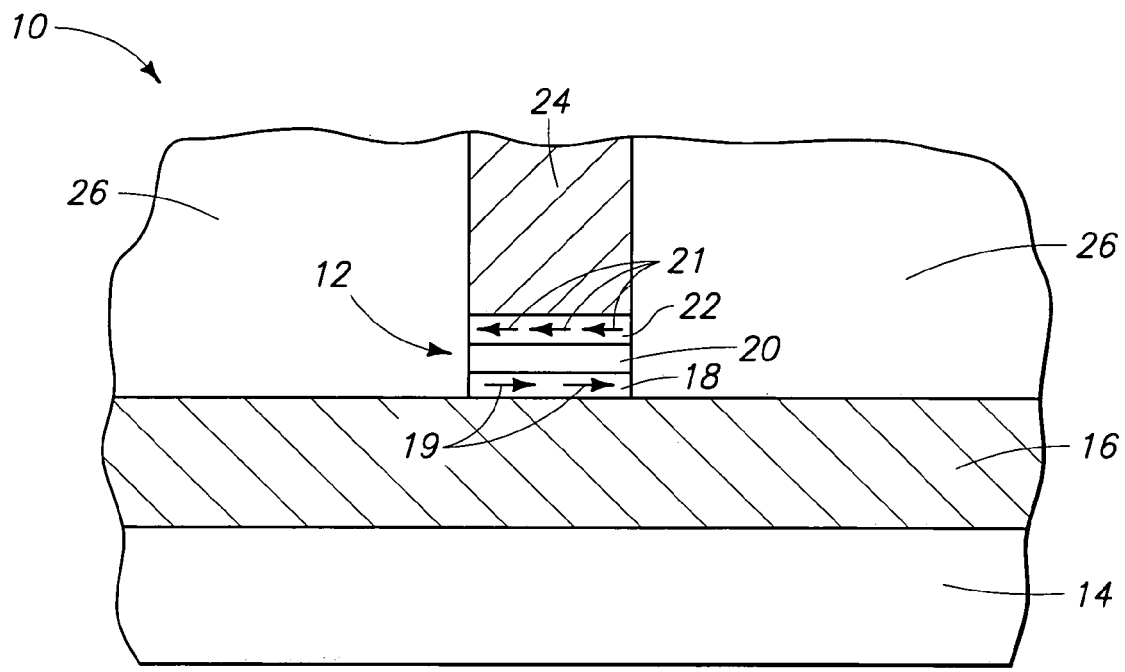
FIG. 1 is a diagrammatic, cross-sectional view of a fragment illustrating a prior art MRAM construction.

This disclosure of the invention is submitted in furtherance of the constitutional purposes of the U.S. Patent Laws "to promote the progress of science and useful arts" (Article 1, Section 8).

The invention provides an integrated circuit comprising operational circuitry; a sensor configured to sense an environmental parameter; and adjustment circuitry coupled to the sensor and to the operational circuitry and configured to affect the operational circuitry to at least partially counteract the effects of the environmental parameter.

Another aspect of the invention provides an MRAM integrated circuit comprising a row line; a column line; an MRAM cell proximate the row line and column line and switchable between first and second binary states in response to current imparted to at least one of the row line and column line, current imparted to the row line in one direction causing a magnetic field operative on the MRAM cell tending to cause the MRAM cell to flip to the second binary state, current imparted to the column line in one direction causing a magnetic field operative on the MRAM cell that is generally additive to the magnetic field caused by current imparted to the row line; first circuitry configured to impart a selectable amount of current to the row line; second circuitry configured to impart a selectable amount of current to the column line; a magnetic sensor proximate the MRAM cell and configured to sense a level of environmental magnetic field applied to the MRAM cell exclusive of any field generated by the row line and column line; and third circuitry coupled to the magnetic sensor and at least one of the first circuitry and second circuitry to selectively adjust the amount of current imparted to at least one of the row line and column line in response to the level sensed by the magnetic sensor.

Another aspect of the invention provides an MRAM circuit comprising a row line; a column line; an MRAM cell proximate the row line and column line and switchable between first and second binary states in response to current imparted to at least one of the row line and column line, current imparted to the row line in one direction causing a magnetic field operative on the MRAM cell tending to cause the MRAM cell to flip to the second binary state, current imparted to the column line in one direction causing a magnetic field operative on the MRAM cell that is generally additive to the magnetic field caused by current imparted to the row line; first circuitry configured to impart a selectable amount of current to the row line; second circuitry configured to impart a selectable amount of current to the column line; a magnetic sensor proximate the MRAM cell and configured to sense magnetic field; a temperature sensor proximate the MRAM cell and configured to sense temperature; and third circuitry coupled to the magnetic sensor, the temperature sensor, and the first circuitry and second circuitry to selectively adjust the amount of current imparted to the row line in response to the magnetic field sensed by the magnetic sensor and temperature sensed by the temperature sensor and to the column line in response to the magnetic field sensed by the magnetic sensor and temperature sensed by the temperature sensor.

Another aspect of the invention provides an MRAM circuit comprising a row line; a column line; an MRAM cell proximate the row line and column line and switchable between first and second binary states in response to current imparted to at least one of the row line and column line, current imparted to the row line in one direction causing a magnetic field operative on the MRAM cell tending to cause the MRAM cell to flip to the second binary state, current imparted to the column line in one direction causing a magnetic field operative on the MRAM cell that is generally additive to the magnetic field caused by current imparted to the row line; first circuitry configured to impart a selectable amount of current to the row line; second circuitry configured to impart a selectable amount of current to the column line; a magnetic sensor proximate the MRAM cell and configured to sense magnetic field; a temperature sensor proximate the MRAM cell and configured to sense temperature; and third circuitry coupled to the magnetic sensor, the temperature sensor, and the first circuitry and second circuitry to selectively adjust the amount of current imparted to the row line in response to the magnetic field sensed by the magnetic sensor and temperature sensed by the temperature sensor and to the column line in response to the magnetic field sensed by the magnetic sensor and temperature sensed by the temperature sensor.

Another aspect of the invention provides an MRAM integrated circuit comprising a plurality of row lines respectively configured to have current of a selectable magnitude imparted thereto in a selectable direction; a plurality of column lines respectively configured to have current of a selectable magnitude imparted thereto in a selectable direction; a plurality of MRAM cells located proximate intersections of row lines and column lines, respectively, and respectively switchable between first and second binary states in response to current imparted to the row line and column line at the intersection proximate the MRAM cell to be switched, depending on the direction and magnitude of the imparted current imparted to the row line and column line; first circuitry configured to select a row line and impart a selectable amount of current to the selected row line; second circuitry configured to select a column line and impart a selectable amount of current to the selected column line; a magnetic sensor proximate the plurality of MRAM cells and configured to sense a level of a magnetic field at the MRAM cells; and third circuitry coupled to the magnetic sensor and at least one of the first circuitry and second circuitry to selectively adjust the amount of current imparted to the selected row line and selected column line in response to the level sensed by the magnetic sensor.

Another aspect of the invention provides a method of compensating an MRAM integrated circuit for the effects of an external magnetic field, the MRAM integrated circuit including a plurality of MRAM cells and circuitry configured to impart a selectable amount of current to a selected row line and column line, the method comprising sensing a level of a magnetic field at the MRAM cells using a magnetic sensor proximate the plurality of MRAM cells; and selectively adjusting the amount of current imparted to the selected row line and selected column line in response to the level sensed by the magnetic sensor.

Another aspect of the invention provides a system for compensating an MRAM integrated circuit for the effects of an external magnetic field, the MRAM integrated circuit including a plurality of MRAM cells and circuitry configured to impart a selectable amount of current to a selected row line and column line, the system comprising means for sensing a level of a magnetic field at the MRAM cells; and means for selectively adjusting the amount of current imparted to the selected row line and selected column line in response to the level sensed by the sensing means.

Another aspect of the invention provides a method of testing an integrated circuit, the method comprising supporting a sensor in the integrated circuit and using the sensor to sense environmental data.

MRAM devices generally work by changing the direction of a magnetic field of a memory cell defined by a crossing row line and column line. The actual switching of the memory cell occurs by application of current to the row and column lines, which apparently imparts a magnetic field of a certain strength to cause the cell to flip from one binary state to another. MRAMs are described in greater detail in, for example, the following U.S. patent applications which are incorporated herein by reference: Ser. No. 10/196,484, filed Jul. 15, 2002, titled "Magnetoresistive Memory Devices, and Methods of Forming Magnetoresistive Memory Devices," and naming as inventor John Mattson, now U.S. Pat. No. 6,806,523; Ser. No. 09/966,699, filed Sep. 27,. 2001, titled "Methods of Forming Magnetoresistive Devices," and naming as inventor Joel A. Drewes, now U.S. Pat. No. 6,656,371; Ser. No. 10/107,605, filed Mar. 26, 2002, titled "Methods of Operating MRAM Devices," and naming as inventor Joel A. Drewes, now U.S. Pat. No. 6,683,806; and Ser. No. 10/121,298, filed Apr. 11, 2002, titled "Semiconductor Constructions and Methods Of Forming Semiconductor Constructions," and naming as inventor Joel A. Drewes, now U.S. Pat. No. 6,627,932.

FIG. 1 illustrates a fragment of an exemplary prior art construction 10 comprising an MRAM device 12. More specifically, construction 10 comprises a substrate 14 having a conductive line 16 formed thereover, and device 12 is formed over the conductive line.

Substrate 14 can comprise an insulative material, such as, for example, borophosphosilicate glass (BPSG), silicon dioxide and/or silicon nitride. Such insulative material can be formed over a semiconductive material, such as, for example, monocrystalline silicon. Further, various integrated circuit devices can be supported by the semiconductive material. In the construction of FIG. 1, substrate 14 is illustrated generically as a homogeneous mass, but it is to be understood from the discussion above that substrate 14 can comprise numerous materials and layers. In the event that substrate 14 comprises a semiconductive material, such semiconductive material can be, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive line 16 can comprise, for example, various metals and metal alloys, such as, for example, copper and/or aluminum.

The MRAM device 12 formed over line 16 comprises three primary layers, 18, 20 and 22. Layers 18 and 22 comprise soft magnetic materials, such as, for example, materials comprising one or more of nickel, iron, cobalt, iridium, manganese, platinum and ruthenium. Layer 20 comprises a non-magnetic material. The non-magnetic material can be an electrically conductive material (such as copper) in applications in which the MRAM is to be a giant magnetoresistive (GMR) device, or can be an electrically insulative material (such as, for example, aluminum oxide ($Al_2O_3$) or silicon dioxide), in applications in which the MRAM device is to be a tunnel magnetoresistive (TMR) device.

Layers 18 and 22 have magnetic moments associated therewith. The magnetic moment in layer 18 is illustrated by arrows 19, and the magnetic moment in layer 22 is illustrated by arrows 21. In the shown construction, the magnetic moment in layer 22 is anti-parallel to the magnetic moment in layer 18. Such is one of two stable orientations for the magnetic moment of layer 22 relative to that of 18, with the other stable orientation being a parallel orientation of the magnetic moment in layer 22 relative to the moment in layer 18. One of layers 18 and 22 can have a pinned orientation of the magnetic moment therein, and such can be accomplished by providing a hard magnetic layer, or in other words a permanent magnet (not shown) adjacent the layer. The layer having the pinned magnetic moment can be referred to as a reference layer.

In operation, MRAM device 12 can store information as a relative orientation of the magnetic moment in layer 22 to that in layer 18. Specifically, either the anti-parallel or parallel orientation of the magnetic moments of layers 18 and 22 can be designated as a 0, and the other of the anti-parallel and parallel orientations can be designated as a 1. Accordingly, a data bit can be stored within device 12 as the relative orientation of magnetic moments in layers 18 and 22.

A conductive line 24 is shown over layer 22, and such conductive line extends into and out of the plane of the page. Conductive line 24 can comprise, for example, one or more metals and/or metal alloys, including, for example, copper and/or aluminum.

An insulative material 26 extends over conductive line 16, and along the sides of bit 12 and conductive line 24. Insulative material 26 can comprise, for example, BPSG.

The construction 10 is an exemplary MRAM construction, and it is to be understood that various modifications can be made to the construction 10 for various applications. For instance, one or more electrically insulative layers (not shown) can be provided between device 12 and one or both of conductive lines 16 and 24. Also, one or more magnetic layers (not shown) can be stacked within device 12 in addition to the shown layers 18 and 22.

In operation, data is written to MRAM device 12 by passing current along the conductive lines 16 and 24 to change the relative magnetic orientation of layers 18 and 22 (i.e., to flip the relative orientation from parallel to anti-parallel, or vice versa). The relative orientation of layers 18 and 22 can be flipped by passing sufficient current along only one of lines 16 and 24, but in practice it is generally found to be advantageous to utilize both of lines 16 and 24 in writing information to device 12. Specifically, some current is initially passed along one of the lines 16 and 24 to induce a magnetic field in device 12 which starts to flip the relative magnetic orientation of layers 18 and 22, and then current is passed along the other of lines 16 and 24 to complete the flip of the relative magnetic orientation within device 12.

The operation of reading information from device 12 can utilize either inductive sensing or magnetoresistive sensing to detect the relative magnetic orientation of layers 18 and 22 within the device. The reading can utilize one or both of lines 16 and 24, and/or can utilize a separate conductive line (not shown).

It is advantageous to have lines 16 and 24 be orthogonal to one another at the location of device 12 to maximize the complementary effect of utilizing both of conductive lines 16 and 24. A device which utilizes a pair of independently controlled conductive lines for writing to and/or reading from an MRAM device is typically referred to as a half-select MRAM construction. Typically, one of the orthogonal lines 16 and 24 will be designated as inducing field Hx parallel to the moments of layers 22 and 18 (with conductive line 24 inducing Hx in the shown embodiment), and the other will be designated as inducing field Hy perpendicular to the moments of layers 22 and 18 (with conductive line 16 inducing Hy in the shown embodiment). Accordingly, lines 16 and 24 induce orthogonal magnetic fields within MRAM device 12.

Figure 2:
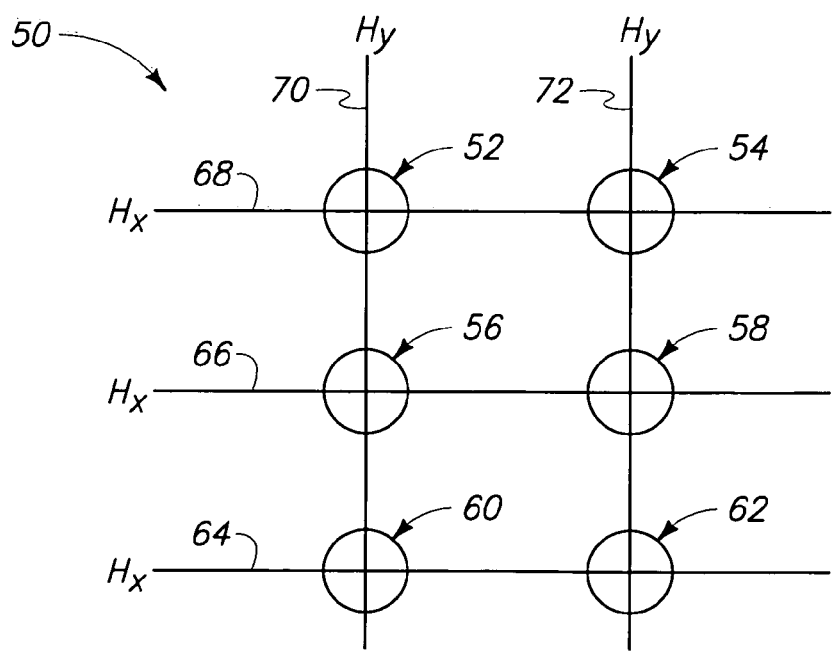
FIG. 2 is a diagrammatic illustration of a prior art memory array comprising MRAM devices.

As discussed above, a single MRAM device can store a single bit of information. Accordingly, in applications in which it is desired to process multiple bits of information, it is generally desired to utilize a plurality of MRAM devices, with each of the devices independently storing bits of information. The devices will typically be arranged in an array, and an exemplary array 50 of MRAM devices is illustrated in FIG. 2. The array comprises individual MRAM devices 52, 54, 56, 58, 60 and 62. The array also comprises a plurality of conductive lines 64, 66 and 68 utilized for inducing Hx, and a plurality of conductive lines 70 and 72 utilized for inducing Hy.

In operation, information is written to an individual MRAM device by passing current through the lines that intersect at the device to simultaneously induce Hx and Hy within the device. For instance, information can be written to device 52 by passing current simultaneously along lines 68 and 70. Preferably, the current passed along either of lines 68 and 70 will be insufficient to change a memory state of an MRAM device by itself, and accordingly the memory states of devices 54, 56 and 60 will be unaffected during the writing of information to device 52.

Figure 3:
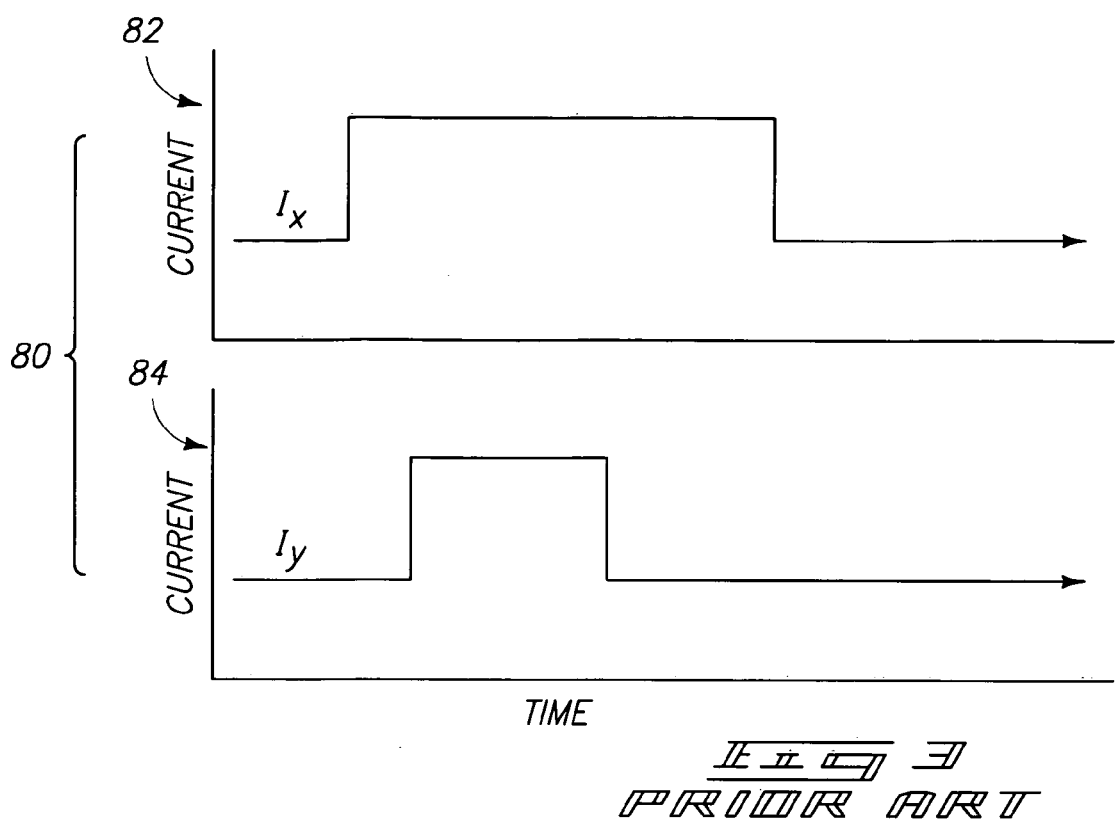
FIG. 3 is a diagrammatic illustration of a pair of graphs of current versus time illustrating prior art current pulses along directions $I_x$ and $I_y$ which are utilized to induce changes of magnetic orientation in an MRAM device.

FIG. 3 illustrates a diagram 80 showing typical current pulses which will be passed along lines 68 and 70 during an operation of writing information to an MRAM device. The current utilized to induce Hx is labeled as Ix, and the current utilized to induce Hy is labeled as Iy.

Diagram 80 comprises a pair of overlaid graphs 82 and 84 illustrating current flow along Ix and Iy, respectively, as a function of time. The peak amount of current passed along Ix and Iy will typically be from about 0.2 milliamp to about 100 milliamps, and will typically induce a magnetic field within an MRAM device (for example device 12 of FIG. 1), of from about 10 Oersteds to about 200 Oersteds. It is noted that the current flow along Ix is increased prior to an increase of current along Iy, but in alternative applications the current along Iy can be increased (sometimes referred to as being turned "on") prior to the current along Ix. In the shown application, there is a window of time where current flows along both Ix and Iy simultaneously, followed by a window of time where current continues along Ix after the current along Iy has been reduced to a base level. The reason for the additional current along Ix after reducing the current along Iy to a base level is to insure that a memory state of an MRAM device has been fully flipped to a stable configuration (i.e., fully flipped from an anti-parallel orientation to a parallel orientation, or vice versa) prior to reducing the current along Ix to its initial base level.

Figure 4:
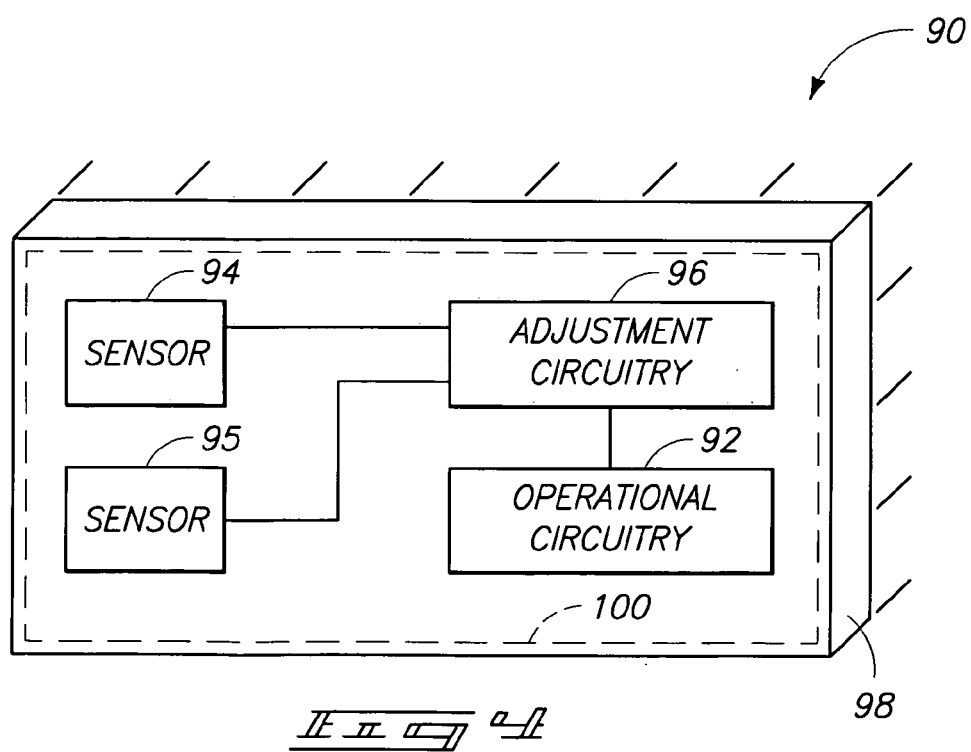
FIG. 4 is a perspective view, partly in block diagram form, of an integrated circuit embodying various aspects of the invention.

FIG. 4 is a perspective view, partly in block diagram form, of an integrated circuit 90 embodying various aspects of the invention. The integrated circuit 90 includes operational circuitry 92. The operational circuitry 92 can be any analog or digital circuitry typically included in an integrated circuit.

The integrated circuit 90 further includes a sensor 94 to sense or monitor an environmental parameter. For example, the sensor can sense an environment parameter from time to time or continually. The sensor can be, for example, a temperature sensor, a pressure sensor, a magnetic sensor, or any sensor that may affect the operation of the operational circuitry 92. In one embodiment, one or more additional sensors 95 are also included. For example, the sensor 95 may sense a different parameter than is sensed by the sensor 94.

In one embodiment, the integrated circuit 90 further includes adjustment circuitry 96 coupled to the sensors 94 and 95 and to the operational circuitry and configured to affect the operational circuitry 92 to at least partially counteract or compensate for the effects of the environmental parameter. The sensors 94 and 95 can alternatively or in addition be used during testing or manufacturing.

The integrated circuit 90 further comprises an integrated circuit package 98 which houses the operational circuitry 92 and the adjustment circuitry 96. The sensors 94 and 95 are also housed in the integrated circuit package 98.

The integrated circuit 90 includes a substrate 100 in the package 98. The substrate 100 supports the operational circuitry 92 and the adjustment circuitry 96. The sensors 94 and 95 are supported by the substrate 100.

In one embodiment, the adjustment circuitry is included in the operational circuitry 92. For example, the operational circuitry 92 may be a microprocessor.

The inventors have recognized that, of these types of sensors, a magnetic sensor is particularly valuable when used with MRAM integrated circuits.

Consider, for example, in operation or switching of a given MRAM cell, that it is desirable to impart a magnetic field of 60 Oersteds. Such might, by way of example only, be imparted by sending a current to a row line effective to impart 40 Oersteds of magnetic field, coupled with another current to the current line in question, desired to impart 20 Oersteds, with the total being 60 Oersteds at the intersecting cell. Consider also that MRAMs are sensitive to adjacent cells being flipped, and may inadvertently be flipped because of minor variations in current or external magnetic field used in connection with the adjacent cells. For example, consider or recognize that here on earth the typical surrounding magnetic field is, on average, 0.8 Oersted. However, an unshielded or poorly placed chip next to a magnetic source, for example a transformer, might see 10 Oersteds of magnetic field. In such instance, it would be desirable to apply less current to the intersecting lines to assure that adjacent cells are not also inadvertently flipped.

Figure 5:
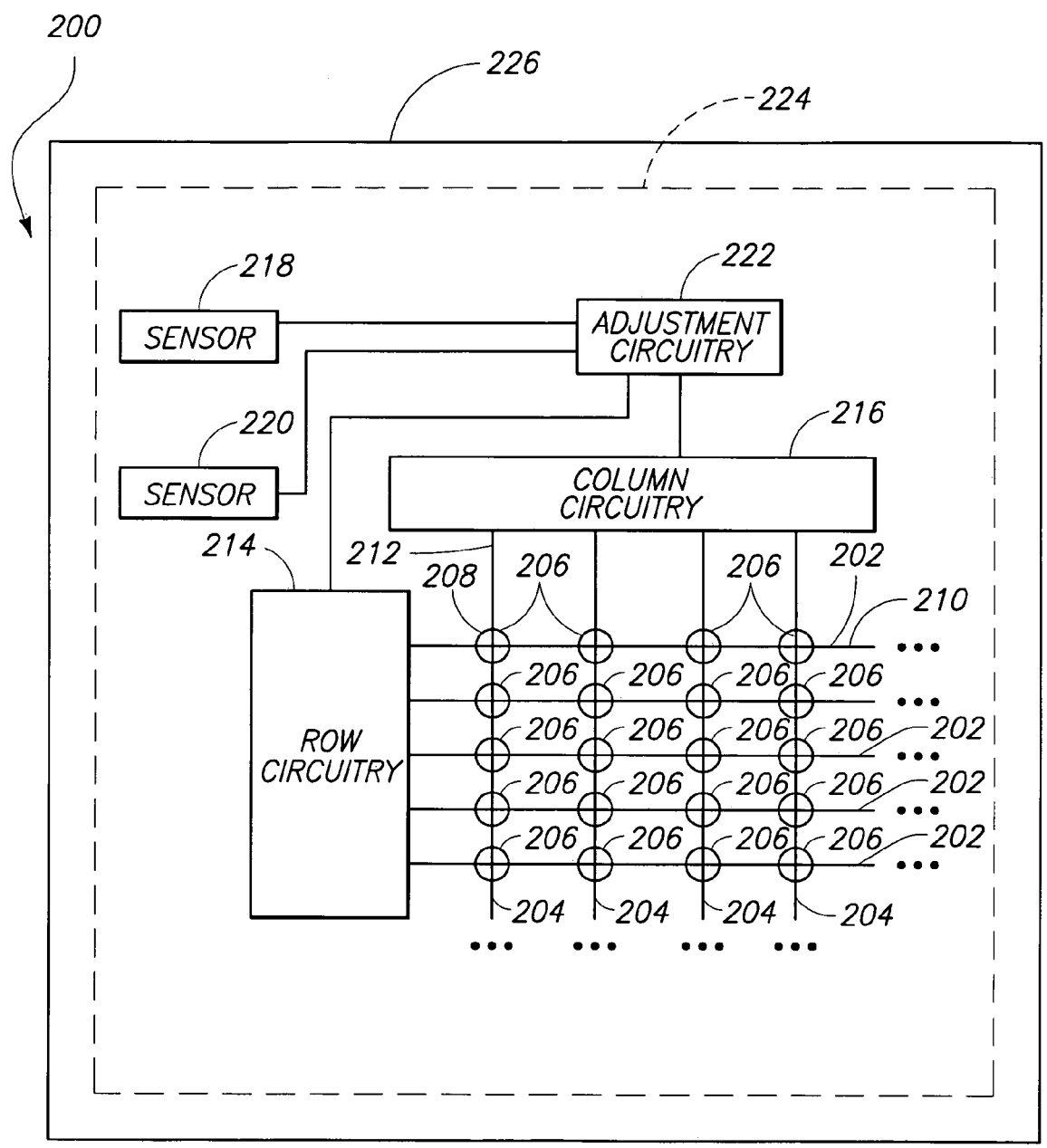
FIG. 5 is a block diagram of an MRAM integrated circuit.

Therefore, FIG. 5 shows an MRAM integrated circuit 200 which includes at least a magnetic sensor to address these problems. The integrated circuit 200 includes multiple "row" lines 202 and multiple "column" lines 204. MRAM cells 206 are located at or near intersections of row lines 202 and column lines 204. The MRAM cells 206 can each be switched or toggled between first and second binary states in response to current imparted to at least one of the associated intersecting row lines 202 and column lines 204, it being kept in mind that an MRAM cell can be toggled by current applied to just one of the intersecting row lines and column lines.

For any particular MRAM cell, e.g., cell 208, current imparted to the associated row line 210 in one direction causes a magnetic field operative on the MRAM cell 208 tending to cause that MRAM cell 208 to flip from the first binary state (e.g., binary zero) to the second binary state (e.g., binary one). Current imparted in the opposite direction on the row line 210 causes a magnetic field operative on the same MRAM cell 208 tending to cause that MRAM cell to flip from the second binary state to the first binary state. Similarly, current imparted to the column line 212 in one direction causes a magnetic field operative on the MRAM cell 208 tending to cause that MRAM cell 208 to flip from the first binary state (e.g., binary zero) to the second binary state (e.g., binary one). Current imparted in the opposite direction to the column line 212 causes a magnetic field operative on the same MRAM cell 208 tending to cause that MRAM cell to flip from the second binary state to the first binary state. Current imparted to the column line 212 in one direction causes a magnetic field operative on the MRAM cell 208 that is generally additive to the magnetic field caused by current imparted in one direction to the row line 210.

The integrated circuit 200 includes circuitry configured to impart a selectable amount of current in a selectable direction to a selected row line. More particularly, in the illustrated embodiment, the integrated circuit 200 includes row circuitry 214. In one embodiment, multiple rows can be controlled at the same time by the row circuitry 214. In one embodiment, current level and direction on one row can be different than the current level and direction imparted, by the row circuitry 214, on another row at the same time.

The integrated circuit 200 further includes circuitry configured to impart a selectable amount of current in a selectable direction to a selected column line. More particularly, in the illustrated embodiment, the integrated circuit 200 includes column circuitry 216. In one embodiment, multiple columns can be controlled at the same time by the column circuitry. In one embodiment, current level and direction on one column can be different than the current level and direction imparted, by the column circuitry 216, on another column at the same time.

The integrated circuit 200 further includes a sensor 218 proximate the MRAM cells 206. In one embodiment, the sensor 218 is a magnetic sensor to sense a level of environmental magnetic field applied to the MRAM cells 206 or to the integrated circuit 200 in general. In one embodiment, the magnetic sensor 218 is located in the integrated circuit 200 or read at predetermined times such that it is not affected by any field generated by the row lines 202 and column lines 204. In other words, the magnetic sensor is configured to sense magnetic fields applied to the integrated circuit 200 from external of the integrated circuit 200. In one embodiment, the magnetic sensor is configured to detect orientation of a magnetic field.

The integrated circuit 200 further includes adjustment circuitry 222 coupled to the magnetic sensor 218 and to at least one of the row circuitry 214 and the column circuitry 216 to selectively adjust the amount of current imparted to the row lines 202 and column lines 204 in response to the level sensed by the magnetic sensor 218. The circuitry 222 also selectively adjusts the amount of current imparted to the row lines 202 and column lines 204 in response to the orientation sensed by the magnetic sensor 218. The current is adjusted to at least partially compensate for the effects of magnetic fields sensed by the magnetic sensor 218. In one embodiment, a second sensor 220 is included in the integrated circuit 200 (or multiple additional sensors are included) for sensing magnetic fields, pressure, temperature, and/or any other parameter that may affect operation of the integrated circuit 200. These additional sensors are coupled to the adjustment circuitry 222 which, in one embodiment, compensates for environmental parameters sensed or monitored by all the sensors 218 and 220.

In one embodiment, multiple magnetic sensors 218 are included in the integrated circuit 200 and different adjustments are made for memory cells in different locations of the integrated circuit.

The integrated circuit 200 includes a substrate 224, such as a silicon substrate, supporting the MRAM cells 206, and the magnetic sensor 218 is supported by the same substrate 224. An additional sensor 220, if included, is also supported by the substrate 224, in one embodiment.

The integrated circuit 200 includes an integrated circuit package 226 (similar to the package 98 shown in FIG. 4) housing the substrate 224, the MRAM cells 206, the row and column circuitry 214 and 216, and the adjustment circuitry 222 configured to adjust the amount of current. In one embodiment, the magnetic sensor 218 and the sensor 220 are also located inside the package 226. In an alternative embodiment, one or both of the sensors 218 and 220 are located outside but proximate the integrated circuit package 226.

In one embodiment, the package 226 is magnetically shielded. The shielding is intended to be and is an effective shield against a magnetic field up to a predetermined amount, e.g., an 80 Oersteds magnetic field. Using 80 Oersteds as an example, if the subject device is subjected to a 100 Oersteds magnetic field, 20 Oersteds of impact gets through, requiring modification of the current on the chip accordingly.

One possible application of significance would be in operations in space. For example, an operating chip launched into space might go from 0.8 Oersted to 100 Oersteds, for example, in orbit. Further, the direction of the magnetic field might change numerous times between north and south as the satellite/rocket ship orbits about the earth, and depending upon the orbital path. In one embodiment, the magnetic sensor that is fabricated into the chip also determines the direction of the magnetic field, which would impact the magnitude of current to be applied or how the cell actually operates.

The invention also has application to the operation of any circuitry, for modifying operation of the chip in light of whatever impacting parameter is being sensed. One or more sensors are built into an integrated circuit chip to collect environmental data during operation to adjust internal operating conditions as required by external environment such as temperature, pressure, or magnetic field. For example, an in situ magnetic sensor on a magnetic memory integrated circuit (MRAM) is built with a magnetic field sensor built into the chip. This allows direct measurement of the magnetic environment of the integrated circuit (e.g., inside of a magnetically shielded package) during operation or manufacture of the device. The integrated circuit environmental information is then used, in one embodiment, to adjust or modify the operating conditions of the integrated circuit, e.g., to change the write currents to allow the chip to be optimized and to overcome a large external magnetic field that would otherwise render the integrated circuit memory prone to errors, or even non-functional. This information is particularly useful since it is measured inside packaging, shielding, and other integrated circuit environmental protection, and therefore in detecting the same conditions which are being applied directly to the integrated circuit.

In one embodiment, the internal sensor is used for testing purposes during manufacture of the integrated circuit.

Thus, an integrated circuit has been provided including a magnetic sensor that is fabricated into the integrated circuit, or otherwise associated therewith, which determines the surrounding magnetic field and modifies or causes modification of operation of the integrated circuit accordingly, for example reducing required current for high magnetic fields. Recognizing also that temperature impacts the required voltage for imparting the magnetic field flipping effect, in one embodiment, a sensor which includes the sensing of temperature is also included in an MRAM integrated circuit or separately utilized with an MRAM integrated circuit.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An MRAM integrated circuit comprising:
   a row line;
   a column line;
   an MRAM cell proximate the row line and column line and switchable between first and second binary states in response to current imparted to at least one of the row line and column line, wherein, in operation, current imparted to the row line in one direction causes a magnetic field operative on the MRAM cell biasing the MRAM cell toward the second binary state, and wherein, in operation, current imparted to the column line in one direction causes a magnetic field operative on the MRAM cell biasing the MRAM cell toward the second binary state;
   first circuitry configured to impart a selectable amount of current to the row line;
   second circuitry configured to impart a selectable amount of current to the column line;
   a magnetic sensor proximate the MRAM cell and configured to sense a level of environmental magnetic field applied to the MRAM cell; and
   third circuitry coupled to the magnetic sensor and at least one of the first circuitry and second circuitry and configured to selectively adjust the amount of current imparted to at least one of the row line and column line in response to the level sensed by the magnetic sensor.

2. An MRAM integrated circuit in accordance with claim 1 and comprising a substrate, wherein the MRAM cell is supported by the substrate, and wherein the magnetic sensor is supported by the substrate.

3. An MRAM integrated circuit in accordance with claim 1 wherein the magnetic sensor is configured to sense magnetic fields applied to the integrated circuit from external of the integrated circuit.

4. An MRAM integrated circuit in accordance with claim 1 and further comprising an integrated circuit package housing the substrate, the MRAM cell, the first and second circuitry, and the circuitry configured to adjust the amount of current, wherein the magnetic sensor is located inside the integrated circuit package.

5. An MRAM integrated circuit in accordance with claim 1 and further comprising a magnetically shielded package housing the substrate, the MRAM cell, the first and second circuitry, and the circuitry configured to adjust the amount of current, wherein the magnetic sensor is located inside the magnetically shielded package.

6. An MRAM integrated circuit in accordance with claim 1 wherein the magnetic sensor is configured to detect orientation of a magnetic field, and wherein the third circuitry is configured to selectively adjust the amount of current imparted to the row line and column line in response to the orientation sensed by the magnetic sensor.

7. An MRAM integrated circuit in accordance with claim 1 wherein the magnetic sensor is configured to sense the level of environmental magnetic field from time to time.

8. An MRAM integrated circuit in accordance with claim 1 wherein the magnetic sensor is configured to continually monitor the level of environmental magnetic field.

9. An MRAM integrated circuit in accordance with claim 1 and further comprising an integrated circuit package housing the MRAM cell and the third circuitry, and wherein the magnetic sensor is housed in the integrated circuit package.

10. An MRAM integrated circuit in accordance with claim 1 and comprising a substrate supporting the MRAM cell and the third circuitry, and wherein the magnetic sensor is supported by the substrate.

11. An integrated circuit in accordance with claim 1 and further comprising a temperature sensor, wherein the adjustment circuitry is coupled to the temperature sensor and to the operational circuitry and configured to affect the operational circuitry in response to the temperature sensed by the temperature sensor.

12. An MRAM circuit comprising:
   a row line;
   a column line;
   an MRAM cell proximate the row line and column line and switchable between first and second states in response to current imparted to at least one of the row line and column line, wherein, in operation, current imparted to the row line in one direction causes a magnetic field on the MRAM cell biasing the MRAM cell toward the second state, and wherein current imparted to the column line in one direction causes a magnetic field on the MRAM cell biasing the MRAM cell toward the second state;
   first circuitry configured to impart a selectable amount of current to the row line;
   second circuitry configured to impart a selectable amount of current to the column line;
   a magnetic sensor proximate the MRAM cell and configured to sense magnetic field;
   a temperature sensor proximate the MRAM cell and configured to sense temperature; and
   third circuitry coupled to the magnetic sensor, the temperature sensor, and the first circuitry and second circuitry to selectively adjust the amount of current imparted to the row line in response to the magnetic field sensed by the magnetic sensor and temperature sensed by the temperature sensor and to the column line in response to the magnetic field sensed by the magnetic sensor and temperature sensed by the temperature sensor.

13. An MRAM circuit in accordance with claim 12 and comprising a substrate, wherein the MRAM cell is supported by the substrate, and wherein the magnetic sensor is supported by the substrate.

14. An MRAM circuit in accordance with claim 12 and further comprising an integrated circuit package housing the substrate, the MRAM cell, the first and second circuitry, and the circuitry configured to adjust the amount of current, wherein the temperature sensor is located inside the integrated circuit package.

15. An MRAM circuit in accordance with claim 12 and further comprising a magnetically shielded package housing the substrate, the MRAM cell, the first and second circuitry, and the circuitry configured to adjust the amount of current, wherein the temperature sensor and magnetic sensor are located inside the magnetically shielded package.

16. An MRAM circuit in accordance with claim 12 and further comprising an integrated circuit package housing the substrate, the MRAM cell, the first, second, and third circuitry, and the circuitry configured to adjust the amount of current, wherein the magnetic sensor is located inside the integrated circuit package.

17. An MRAM circuit in accordance with claim 12 and further comprising a magnetically shielded package housing the substrate, the MRAM cell, the first and second circuitry, and the circuitry configured to adjust the amount of current, wherein the magnetic sensor is located inside the magnetically shielded package.

18. An MRAM circuit in accordance with claim 12 wherein the magnetic sensor is configured to detect orientation of a magnetic field, and wherein the third circuitry is configured to selectively adjust the amount of current imparted to the row line and column line in response to the orientation sensed by the magnetic sensor.

19. An MRAM integrated circuit comprising:
a plurality of row lines configured to have current of a selectable magnitude flow therethrough in selectable directions;
a plurality of column lines configured to have current of a selectable magnitude flow therethrough in selectable directions;
a plurality of MRAM cells located proximate intersections of row lines and column lines, respectively, and respectively switchable between first and second binary states in response to current flow in the row line and column line at the intersection proximate the MRAM cell to be switched, depending on the direction and magnitude of the current in the row line and column line;
first circuitry configured to select a row line and cause a selectable amount of current to flow through the selected row line;
second circuitry configured to select a column line and cause a selectable amount of current to flow through the selected column line;
a magnetic sensor proximate at least one of the MRAM cells and configured to sense a level of a magnetic field at the at least one MRAM cell; and
third circuitry coupled to the magnetic sensor and at least one of the first circuitry and second circuitry to selectively adjust the current flowing through the selected row line and selected column line in response to the level sensed by the magnetic sensor.

20. An MRAM integrated circuit in accordance with claim 19 and comprising a substrate, wherein the MRAM cells are supported by the substrate, and wherein the magnetic sensor is supported by the substrate.

21. An MRAM integrated circuit in accordance with claim 19 wherein the magnetic sensor is configured to sense magnetic fields applied to the integrated circuit from external of the integrated circuit.

22. An MRAM integrated circuit in accordance with claim 19 and further comprising an integrated circuit package housing the substrate, the MRAM cells, the first and second circuitry, and the circuitry configured to adjust the amount of current, wherein the magnetic sensor is located inside the integrated circuit package.

23. An MRAM integrated circuit in accordance with claim 19 and further comprising a magnetically shielded package housing the substrate, the MRAM cells, the first, second and third circuitry, wherein the magnetic sensor is located inside the magnetically shielded package.

24. An MRAM integrated circuit in accordance with claim 19 wherein the magnetic sensor is configured to detect orientation of a magnetic field, and wherein the third circuitry is configured to selectively adjust the amount of current imparted to the row line and column line in response to the orientation sensed by the magnetic sensor.

25. A system for testing an MRAM integrated circuit, including a plurality of MRAM cells, row lines, and column lines, the system comprising:
a sensor supported in the integrated circuit and configured to sense environmental data, wherein the integrated circuit includes circuitry configured to impart a selectable amount of current to a selected row line and column line, and wherein the sensor is a magnetic sensor configured to sense a level of a magnetic field at the MRAM cells applied from external of the integrated circuit; and
circuitry configured to adjust the amount of current imparted to the row line and column line in response to the level sensed by the magnetic sensor.

26. A system for testing an integrated circuit in accordance with claim 25 wherein the data are collected over time.

* * * * *